US009093778B2

(12) United States Patent
Pillet

(10) Patent No.: US 9,093,778 B2
(45) Date of Patent: Jul. 28, 2015

(54) ELECTRICAL CONNECTION DEVICE HAVING IMPROVED CONDUCTANCE

(75) Inventor: Michel Pillet, Cannes (FR)

(73) Assignee: AMC, Cannes (FR)

( * ) Notice: Subject to any disclaimer, the term of this patent is extended or adjusted under 35 U.S.C. 154(b) by 0 days.

(21) Appl. No.: 13/810,452

(22) PCT Filed: Jul. 18, 2011

(86) PCT No.: PCT/FR2011/051704
§ 371 (c)(1),
(2), (4) Date: Jan. 16, 2013

(87) PCT Pub. No.: WO2012/007701
PCT Pub. Date: Jan. 19, 2012

(65) Prior Publication Data

US 2013/0122730 A1 May 16, 2013

(30) Foreign Application Priority Data

Jul. 16, 2010 (FR) ..................................... 10 02988

(51) Int. Cl.

| | |
|---|---|
| ***H05K 9/00*** | (2006.01) |
| ***H01R 13/52*** | (2006.01) |
| ***H01R 4/30*** | (2006.01) |
| ***H01R 4/62*** | (2006.01) |
| ***H01R 13/03*** | (2006.01) |
| ***H01R 43/26*** | (2006.01) |
| *H01R 11/12* | (2006.01) |

(52) U.S. Cl.
CPC ............ *H01R 13/5219* (2013.01); *H01R 4/304* (2013.01); *H01R 4/62* (2013.01); *H01R 13/03* (2013.01); *H01R 43/26* (2013.01); *H01R 11/12* (2013.01)

(58) Field of Classification Search
USPC ............................ 174/357; 439/927, 66, 801
See application file for complete search history.

(56) References Cited

U.S. PATENT DOCUMENTS

| | | | | | |
|---|---|---|---|---|---|
| 3,539,973 | A | | 11/1970 | Antes et al. | 339/143 |
| 3,649,954 | A | | 3/1972 | Kurtz | 339/95 R |
| 4,023,882 | A | * | 5/1977 | Pettersson | 439/426 |
| 4,923,739 | A | | 5/1990 | Jin et al. | 428/221 |
| 5,153,818 | A | | 10/1992 | Mukougawa et al. | 361/395 |
| 5,360,355 | A | | 11/1994 | Ehrler et al. | 439/816 |
| 5,620,290 | A | * | 4/1997 | Homfeldt et al. | 411/533 |
| 5,857,858 | A | | 1/1999 | Gorowitz et al. | 439/86 |
| 5,865,638 | A | * | 2/1999 | Trafton | 439/288 |
| 6,114,645 | A | | 9/2000 | Burgess | 200/512 |
| 6,309,742 | B1 | | 10/2001 | Clupper et al. | 428/304.4 |
| 7,044,755 | B2 | * | 5/2006 | Hatakeyama | 439/97 |
| 7,229,296 | B2 | * | 6/2007 | Pillet | 439/86 |
| 2004/0074338 | A1 | | 4/2004 | Kuhn et al. | 75/415 |

(Continued)

FOREIGN PATENT DOCUMENTS

| | | |
|---|---|---|
| DE | 102008017157 | 10/2009 |
| JP | 53-80589 | 7/1978 |

*Primary Examiner* — Phuong Dinh
(74) *Attorney, Agent, or Firm* — James C. Lydon

(57) ABSTRACT

An electrical connection device, including two conductors (12 and 14), in which at least one of the two conductors is made of aluminum, each conductor has a contact surface, and a conductive element (1) is inserted between the contact surfaces of the conductors. The inserted conductive part has a foam skeleton having open cells of a metal selected from the group consisting of iron, nickel, and the alloys thereof, directly covered with at least one coating of copper, tin, indium or one of the alloys thereof.

19 Claims, 2 Drawing Sheets

(56) References Cited

U.S. PATENT DOCUMENTS

Figure 1:
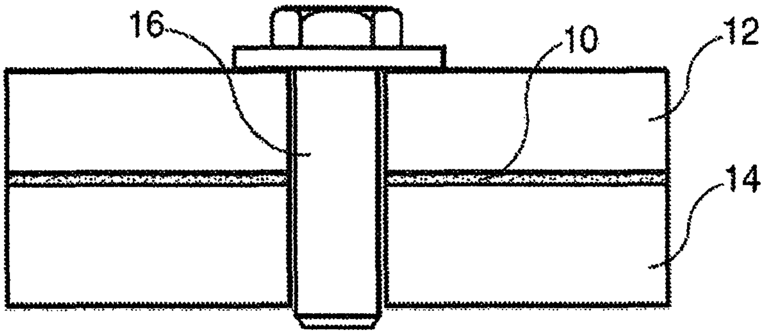

2005/0042895 A1 2/2005 Liu .................................. 439/66
2006/0204741 A1 9/2006 Rehbein et al. ............ 428/304.4
2006/0270277 A1 11/2006 Zhao et al. .................... 439/627
2014/0057482 A1* 2/2014 Su et al. ........................ 439/493

* cited by examiner

ELECTRICAL CONNECTION DEVICE HAVING IMPROVED CONDUCTANCE

The present invention relates to the improvement of the conductance of electrical connections. It relates in particular to a device for an electrical connection between two metal conductors.

In all the fields where metal electrical connections are used, and in particular in the power electrotechnical field, the electrical connections in which two metals are brought into contact degrade over time. This results in significant electrical losses. The consequent loss of efficiency is a major problem. The degradation of these connections is irreversible. In practice, the degradation of the surfaces that are in contact leads to variations of the density of the current through that surface. There are consequential electrical losses through Joule effect and, at the same time, an increase in temperatures, which speeds up the degradation of the connections but also of the conductors and may even cause them to melt.

The maintenance of the connections entails dismantling them in order to resurface the areas in contact. The tools employed for such resurfacing operations are generally rotary disk grinders. These degrade the overall flatness of the surfaces in contact, which causes the areas and the points of contact to be limited in surface area. Since the contact areas are reduced, the connections are then subject to electrical stresses concentrated on these areas and their degradation is all the more rapid.

The French patent published under the number 2,847,391 describes a contact device comprising a conductive element made of silver foam suitable for insertion between the two contact surfaces of two conductors of an electrical connection. The silver foam has proved to be particularly costly.

Furthermore, primarily for cost reasons, the conductors made of copper are now replaced in all the connections with conductors made of aluminum, a metal which has an electrical conductivity very close to that of copper while being much less expensive. The main drawback with aluminum being the formation of a layer of alumina which makes the connectivity fragile in the connections.

One of the aims of the present invention is to provide an electrical connection device which makes it possible to improve the electrical conductance of the connection and to slow down the degradation of the surfaces in contact.

The subject of a first aspect of the invention is thus an electrical connection device comprising two conductors each having a contact surface and a conductive element inserted between the contact surfaces of the conductors. The inserted conductive element consists of a foam skeleton with open cells of a metal chosen from the group consisting of iron, cobalt, nickel and the alloys thereof directly covered with at least one coating of copper, tin, indium or one of the alloys thereof.

In embodiments, the coating is a coating of copper which is itself coated with a coating of tin, indium or one of the alloys thereof.

According to a second aspect, the present invention targets an electrical connection device comprising two conductors each having a contact surface and a conductive element inserted between the contact surfaces of said conductors, the inserted conductive element consisting of a foam skeleton of a metal with open cells, in which the metal foam forming the skeleton of the inserted conductive element (10) is impregnated with grease.

According to a third aspect, the present invention targets an electrical connection device comprising two conductors, each having a contact surface and a conductive element inserted between the contact surfaces of said conductors, the inserted conductive element consisting of a foam skeleton of a metal with open cells, in which the metal foam forming the skeleton of the inserted conductive element forms a seal at the periphery of the contact surfaces.

According to a fourth aspect, the present invention targets a clamping system which comprises a clamping means suitable for bringing together two conductors around an inserted conductive element consisting of a foam skeleton of a metal with open cells intended to reduce the electrical resistance of the connection, the metal of the metal foam being chosen from the group consisting of iron, cobalt, nickel and the alloys thereof directly covered with at least one coating of copper, tin, indium or one of the alloys thereof.

According to a fifth aspect, the present invention targets an electricity meter, which comprises an electrical connection device according to one of the first to third aspects of the present invention or a clamping system that is the subject of the fourth aspect of the invention.

According to a sixth aspect, the present invention targets a crimp terminal fitting, which comprises a conductive element consisting of a foam skeleton of a metal with open cells intended to reduce the electrical resistance of the connection, the metal of the metal foam being chosen from the group consisting of iron, cobalt, nickel and the alloys thereof directly covered with at least one coating of copper, tin, indium or one of the alloys thereof.

In practice, crimping presents the same problems as the other connections, problems that are explained above.

According to a seventh aspect, the present invention targets a method for electrically connecting two conductors each having a contact surface, comprising a step of positioning said contact surfaces facing one another, characterized in that it comprises a step of positioning, between said contact surfaces, an inserted conductive element consisting of a foam skeleton with open cells of a metal chosen from the group consisting of iron, cobalt, nickel and the alloys thereof directly covered with at least one coating of copper, tin, indium or one of the alloys thereof.

Figure 2:
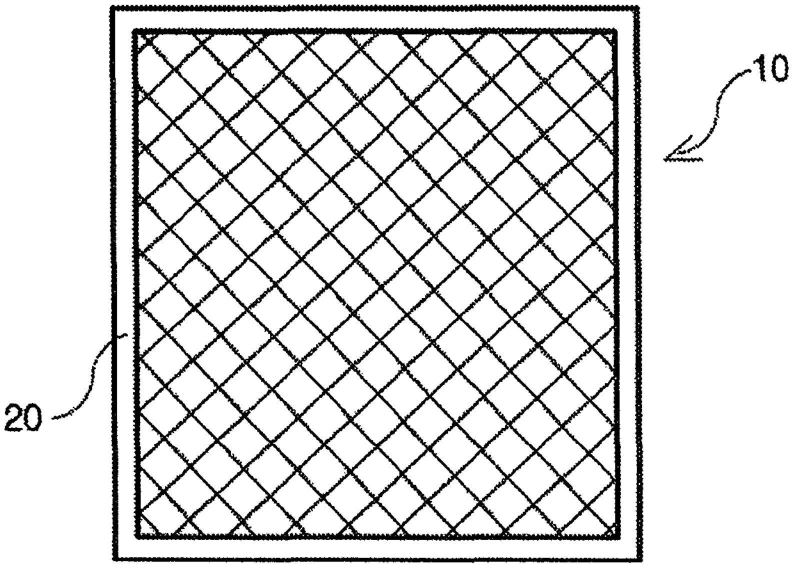
Figure 3A:
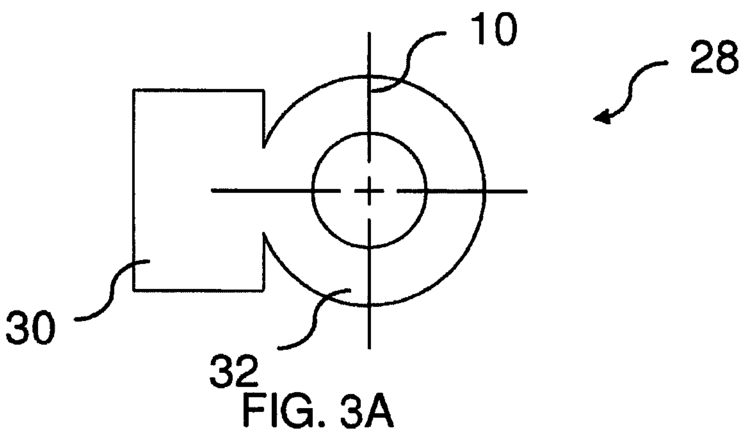
Figure 3B:
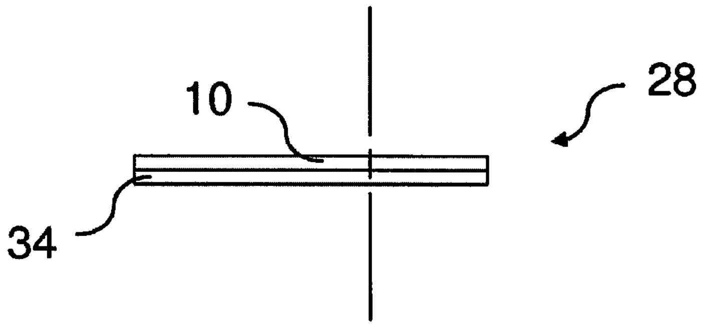
Figure 4:
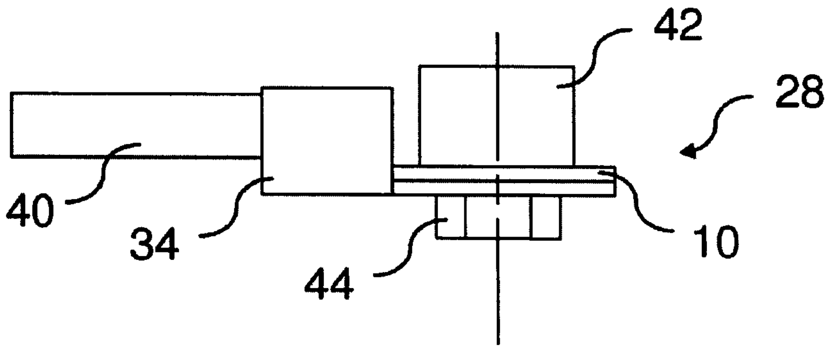

Other aims, objects and features of the invention will appear more clearly on reading the following description, given with reference to the drawings in which:

FIG. 1 represents a cross section of a particular embodiment of the electrical connection device according to the invention, FIG. 2 represents the inserted conductive element of the device according to the invention illustrated in FIG. 1 and comprising a peripheral seal, FIGS. 3A and 3B represent, respectively in plan view and in side view, a particular embodiment of a crimp terminal that is the subject of the sixth aspect of the present invention, before crimping, and FIG. 4 represents, in side view, the crimp terminal illustrated in FIGS. 3A and 3B, after crimping and fastening on a conductor.

A first aspect of the present invention is described first of all, in relation to FIGS. 1 and 2. An electrical connection device according to the invention may be the device illustrated in FIG. 1. Two conductors 12 and 14 are separated by an inserted conductive element 10 made of metal foam so that their respective surfaces enter into contact with the foam. The electrical connection between the conductors 12 and 14 is produced by clamped contact by virtue of a clamping means such as a clamping bolt 16 passing through the two conductors and the inserted conductive element 10.

In embodiments such as that which is illustrated in FIGS. 1 and 2, at least one of the conductors is made of aluminum.

However, the present invention is not limited to this case and applies to all conductors, for example made of copper.

The metal foam of the inserted element 10 is a foam with open cells consisting of a foam skeleton of a metal chosen from the group consisting of iron, cobalt, nickel and the alloys thereof directly covered with at least one metal coating such as a coating of tin, indium or one of the alloys thereof.

The foam skeleton can be obtained by electrolysis. In this case, a sheet of foam of plastic material such as a polyurethane foam is made electrically conductive and is used as cathode in an electrolytic bath, which makes it possible to cover all the surfaces of the open cells of the foam with a layer of metal.

A second method for obtaining the sheet of metal foam consists in depositing the metal by the vacuum deposition technique.

A third method consists of a third step of activation of the foam of plastic material by chemical deposition of a layer of metal of small thickness, followed by a second step of electrolysis during which a layer of the same metal of suitable thickness is deposited by electrolysis.

After the deposition of the layer of metal, the polyurethane is stripped away by a suitable method, for example by burning in an oven. The polyurethane burns and disappears, leaving only a skeleton consisting exclusively of metal.

The structure of the foam 10 obtained in this way is cellular and its physical properties primarily are high porosity and deformability, which has the effect of reducing the electrical resistance of the connection, as well as a low density of the order of 400 g/m. It will be noted that the porosity represents the ratio of void to the overall volume. Preferentially, this ratio is greater than 50% and, even more preferentially, than 70%. The deformability represents the ratio of the minimum thickness of the foam under pressure relative to the thickness of the foam before pressurization. This ratio is preferentially less than 50% and, even more preferentially, than 10%.

In the embodiment represented, the foam 10 thus mostly consists of void because of its cellular structure. Because of this, the surface of the foam 10 comprises a multitude of points of contact of the order of a micron, in numbers of up to 30 points per $mm^2$. The thickness of the foam 10 is of the order of 2 mm. By virtue of these points, the inserted element 10 has numerous contacts, a high conductivity and therefore a low resistance. The choice of iron, cobalt, nickel or one of the alloys thereof, which are metals that exhibit great hardness, makes it possible to obtain hard points capable of penetrating into the surface of the conductors under the effect of the clamping of these conductors.

One feature of the invention is that the metal foam skeleton is directly covered with a coating of another metal, by electrolysis or any other method (spraying, immersion in a bath, etc.) such that the entire cellular surface is coated with this other metal. Unlike the metal forming the skeleton, the coating metal is preferentially ductile in order to increase the contact surface area of each point of the metal forming the skeleton, to penetrate into striae of the surface of the conductor and to improve the electrochemical compatibility between the foam skeleton and the metal of the conductor, for example aluminum or copper, in order to generate micro-welds. Thus, the outer coating metal of the skeleton is preferentially tin, indium or one of the alloys thereof.

It will be noted that the first coating can also be covered with another coating of a metal different from that of the first coating, and so on. For example, if the first coating is of tin, the second coating can be of indium or, if the first coating is of copper, the second can be of tin.

According to a preferential embodiment of the invention, the inserted conductive element 10 consists of a nickel foam skeleton covered with a coating of tin.

As illustrated in FIG. 2, the inserted element 10 preferably comprises a peripheral seal 20. This peripheral seal 20 can be produced in different ways. It can be impregnated in the foam or produced by the deposition of a sealing product of elastomer type on the periphery. It is also possible to produce the seal 20 by folding in the edges of the sheet of foam 10 at least once on itself or by rolling the edges of the sheet of foam 10. Under the effect of the pressure, the thickness of the sheet of foam is made uniform, which means that the density is at least doubled in the areas where the foam is folded in, with the effect of producing the seal concerned at the periphery of the inserted conductive element 10.

The peripheral seal 20 makes it possible to reduce the ingress of degrading external agents by creating a tight barrier at the periphery of the contact. In practice, and in particular in the case of electrolysis tanks, the degrading agents are generally liquids such as soda or washing water or any other polluting product conveyed by the water.

The device according to the invention can be used for a new electrical connection. In this case, it improves the uniformity of the passage of the current through the surfaces in contact. In practice, in an electrical connection, the contact is all the greater when it is located in proximity to the clamping means or clamping bolt 16. Consequently, the resistance, and therefore the electrical losses, of the electrical connection consisting of the conductors 12 and 14 in contact is minimal close to the clamping means 16 and increases more with distance away therefrom. This non-uniform distribution of the current promotes an area of higher current concentration and therefore an area that is more stressed and therefore degraded more rapidly. The addition of the inserted conductive element 10 consisting of foam increases the points of contact between the two conductors 12 and 14 and therefore allows a uniform distribution of the current over the entire contact surface. By virtue of this uniform distribution, there are no areas of current concentration, and therefore no areas that are more stressed and liable to faster degradation.

The device according to the invention can also be advantageously used for a contact of a degraded or deformed electrical connection. Thus, in the case of conductors made of aluminum, the oxygen of the air causes the formation of a layer of aluminum oxide, alumina, which increases the resistance of the connection. In order to avoid the formation of the layer of alumina, in the prior art, it was thought to weld the two conductors together by using an explosion welding method. However, this technique is very costly and difficult to implement. The use of the inserted element made of foam 10, after or without the removal of the alumina, is quick and inexpensive.

In the field of electrolysis tanks and of steel-making furnaces, the conductors and the electrical connections are subjected to currents of high intensity and at high temperatures. The wear of the connections is reflected mainly in a deformation of the contact surfaces of the electrical connections. This results in significant electrical losses that can be as high as several KW per connection and variations in the passage of current through the surfaces in contact. The re-machining of the deformed contact surfaces is therefore no longer necessary by using an inserted conductive element 10 according to the invention.

There is thus obtained a significant improvement in the electrical connections having degraded and deformed contact surfaces, even when deformations of the order of a millimeter are involved. In practice, the deformability of the foam 10 enables it to follow the degraded contours of the surfaces of the conductors 12 and 14 in contact and thus to increase the contact surface and to distribute the pressure exerted by virtue of the clamping means 16.

Furthermore, the points situated on the surface of the foam 10 also pierce the layers of oxide such as alumina which are permanently formed on the surface of the conductors 12 and 14, which makes it possible to improve the electrical conductance of a worn connection, and do so without cleaning it first.

According to a variant embodiment, the foam forming the inserted conductive element 10 is impregnated (filled) with grease which completely fills the cells of the foam, which prevents the ingress of pollutants or of agents likely to oxidize or degrade the surfaces. It will be noted that the grease can be conductive, so as to increase the electrical conductance of the foam. Such a grease is, notably, known by the registered trademark "Penetrox". Furthermore, this grease may incorporate anti-oxidation products and metal particles of a few microns increasing its life. The particles may be particles of silver, gold or any other metal that is a good conductor of electricity. As a variant, the foam forming the inserted conductive element 10 is impregnated, or filled, with a component, for example basic, suitable for reducing the formation of a layer of high resistivity on the surface of at least one of the conductors 12 and 14, for example the alumina on an aluminum conductor, and/or for cleaning the surface of at least one of the conductors 12 and 14.

The device according to the invention is all the more advantageous as its effectiveness increases with temperature. In practice, the drop in potential of a connection of 1 $dm^2$ using the device according to the invention with a foam 10 of nickel covered with tin is of the order of a few mV for a current of an intensity of 5000 A and at a temperature of 80° C. This particular feature is due to the fact that the points of the foam 10 are welded under the effect of the temperature to the conductors 12 and 14 with which they are in contact.

As already mentioned, the device according to the invention is particularly advantageous for improving the conductance of the electrical connections in which the two conductors are made of aluminum, but also when one of the two conductors is made of copper and the other of aluminum or when both conductors are made of copper.

Finally, by virtue of the reduction of the electrical losses that it induces, the device according to the present invention is particularly adapted to currents of high intensity greater than 1000 A.

It will be noted that the use of elastically deformable foam also offers the advantage of reducing the impact of a loosening of the clamping means since, in this case, the foam expands and continues to follow the contact surfaces, at the cost of a lower pressure on these contact surfaces.

In embodiments, the inserted conductive element 10 consists of a foam skeleton of a metal with open cells of high porosity and deformability, the metal being chosen from the group consisting of iron, cobalt, nickel and the alloys thereof directly covered with at least one coating of copper or one of the alloys thereof.

Preferentially, the coating of copper is, itself, coated with a coating of tin, indium or one of the alloys thereof. In particular, the inventor has determined that a nickel foam coated with copper, itself coated with tin, exhibits very advantageous electrical connection characteristics.

According to a second aspect, the present invention targets an electrical connection device comprising two conductors, 12 and 14, each having a contact surface and a conductive element 10 inserted between the contact surfaces of said conductors, the inserted conductive element 10 consisting of a foam skeleton of a metal with open cells, in which the metal foam forming the skeleton of the inserted conductive element 10 is impregnated with grease.

As has been seen, these characteristics allow for an improvement of the electrical connection.

Preferentially, the grease is a conductive grease.

Preferentially, the foam of the inserted element has a high porosity and deformability, which has the effect of reducing the electrical resistance of the connection by virtue of the quality of the contacts formed by the points of contact of the foam on each of the conductors and, possibly, by virtue of the passage through the alumina that they allow.

According to a third aspect, the present invention targets an electrical connection device comprising two conductors, 12 and 14, each having a contact surface and a conductive element 10 inserted between the contact surfaces of said conductors, the inserted conductive element 10 consisting of a foam skeleton of a metal with open cells, in which the metal foam forming the skeleton of the inserted conductive element 10 forms a seal at the periphery of the contact surfaces.

As has been seen, these characteristics allow for an improvement of the electrical connection.

According to a fourth aspect, the present invention targets a clamping system comprising a clamping means, such as a clamping bolt 16, intended to bring together the two conductors and the inserted conductive element 10. The electrician then simply has to position the conductors 12 and 14 around the inserted conductive element then tighten the clamping means to obtain the favorable effects of the present invention.

Other features of this second, third or fourth aspect of the invention are essential, preferential or advantageous features of the first aspect of the invention, as described in relation to FIGS. 1 and 2.

According to a fifth aspect, the present invention targets an electricity meter, which comprises an electrical connection device according to one of the first to third aspects of the present invention or a clamping system that is the subject of the fourth aspect of the invention. The inventor has determined that one in every two domestic fires originates from the domestic meters. The implementation of the present invention in an electrical connection device associated with an electricity meter is therefore particularly advantageous. In practice, despite the thermal cycles, the elastic deformation of the foam 10 ensures that an electrical contact is maintained that avoids, or at least retards, the overheating due to the Joule effect. The present invention thus applies equally to high currents and to low currents.

According to a sixth aspect, illustrated in FIGS. 3A, 3B and 4, the present invention targets a crimp terminal fitting and a crimp terminal provided with this fitting, which comprise a conductive element 10 consisting of a foam skeleton of a metal with open cells intended to reduce the electrical resistance of the connection, the metal of the metal foam being chosen from the group consisting of iron, cobalt, nickel and the alloys thereof directly covered with at least one coating of copper, tin, indium or one of the alloys thereof.

As illustrated in FIGS. 3A and 3B, in one embodiment, the crimp terminal 28 that is the subject of the invention consists, before crimping, of a flat sheet of foam 10 comprising:

- an area 30 to be folded in to crush a conductive cable 40 and a contact area 32 intended to be pressed onto a conductor 42 by a clamping means 44.

For example, the conductor 42 is a vehicle battery terminal.

Preferentially, the form of the sheet of foam 10 corresponds to the form of a metal sheet 34 to which the sheet of foam is linked. The sheet of foam 10 thus produces a crimp terminal fitting which, once associated with the metal sheet 34, forms a crimp terminal.

As illustrated in FIG. 4, after the crushing of the area 30 on the cable 40 and positioning of the clamping means, the terminal ensures an electrical contact between the cable 40 and the conductor 42. This electrical contact has a very low resistance compared to the known prior art in the field of crimping. The other features and advantages of the invention explained in relation to FIGS. 1 and 2 also constitute features and advantages of the crimp terminal that is the subject of the sixth aspect of the invention.

The invention claimed is:

1. An electrical connection device comprising two conductors (12 and 14) each having a contact surface and a conductive element (10) inserted between the contact surfaces of said conductors, the conductive element comprising a metal foam skeleton having open cells intended to reduce the electrical resistance of an electrical connection;

said metal foam skeleton comprising a metal chosen from the group consisting of iron, cobalt, nickel and the alloys thereof, said metal foam skeleton being directly covered with at least one coating selected from the group consisting of copper, tin, indium and one of the alloys thereof.

2. The device as claimed in claim 1, in which the coating is a coating of copper or one of the alloys thereof, itself covered with a coating of tin, indium or one of the alloys thereof.

3. The device as claimed in claim 1, in which at least one of the two conductors (12 and 14) is made of aluminum.

4. The device as claimed in claim 1, in which the inserted conductive element (10) comprises a nickel foam skeleton.

5. The device as claimed in claim 4, in which the nickel foam skeleton is covered with a coating of tin.

6. The device as claimed in claim 1, adapted for use with a current of intensity greater than 1000 amperes.

7. The device as claimed in claim 1, in which the conductive element (10) comprises at least one seal (20) at its periphery creating a barrier against degrading external agents.

8. The device as claimed in claim 7, in which the seal (20) is produced by deposition of a sealing elastomer on the periphery of the conductive element (10).

9. The device as claimed in claim 7, in which the seal (20) is produced by at least one folding-in of an edge of the conductive element (10).

10. The device as claimed in claim 1, in which the metal foam forming the skeleton of the conductive element (10) is impregnated with grease.

11. The device as claimed in claim 10, in which the grease is a conductive grease.

12. The device as claimed in claim 1, in which the metal foam forming the skeleton of conductive element (10) is impregnated with a component suitable for reducing the formation of a layer of high resistivity on the surface of at least one of the conductors (12, 14) and/or for cleaning the contact surface of at least one of the conductors.

13. A clamping system comprising a clamping means (16) suitable for bringing together two conductors and an conductive element (10) inserted therebetween, said conductive element (10) comprising a metal foam skeleton having open cells intended to reduce the electrical resistance of an electrical connection, the metal of the metal foam skeleton being chosen from the group consisting of iron, cobalt, nickel and the alloys thereof, said metal foam skeleton being directly covered with at least one coating selected from the group consisting of copper, tin, indium and one of the alloys thereof.

14. The clamping system as claimed in claim 13, in which the metal foam skeleton is made of nickel directly covered with a coating of copper.

15. The clamping system as claimed in claim 13, in which the metal foam skeleton is made of nickel covered, directly or indirectly, with a coating of tin.

16. An electricity meter comprising an electrical connection device as claimed in claim 1.

17. A crimp terminal fitting comprising a conductive element (10) comprising a metal foam skeleton having open cells intended to reduce the electrical resistance of an electrical connection, the metal of the metal foam skeleton being chosen from the group consisting of iron, cobalt, nickel and the alloys thereof, said metal foam skeleton being directly covered with at least one coating selected from the group consisting of copper, tin, indium and one of the alloys thereof.

18. A method for electrically connecting two conductors (12 and 14) each having a contact surface, said method comprising positioning said contact surfaces facing one another, inserting, between said contact surfaces, a conductive element (10) comprising a metal foam skeleton having open cells of a metal chosen from the group consisting of iron, cobalt, nickel and the alloys thereof, said metal foam skeleton being directly covered with at least one coating selected from the group consisting of copper, tin, indium and one of the alloys thereof.

19. An electricity meter comprising a clamping system as claimed in claim 13.

* * * * *